US008896921B2

(12) United States Patent
Lee (10) Patent No.: US 8,896,921 B2
(45) Date of Patent: Nov. 25, 2014

(54) WIRE GRID TYPE POLARIZATION STRUCTURES, METHODS OF MANUFACTURING WIRE GRID TYPE POLARIZATION STRUCTURES, AND ORGANIC LIGHT EMITTING DIODE (OLED) DISPLAYS HAVING WIRE GRID TYPE POLARIZATION STRUCTURES

(71) Applicant: Samsung Display Co., Ltd., Yongin, Gyeonggi-do (KR)

(72) Inventor: Hyun-Shik Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/866,952

(22) Filed: Apr. 19, 2013

(65) Prior Publication Data

US 2014/0027738 A1   Jan. 30, 2014

(30) Foreign Application Priority Data

Jul. 27, 2012  (KR) .................. 10-2012-0082227

(51) Int. Cl.
*G02B 27/28*   (2006.01)
*H01L 51/52*   (2006.01)
*H01L 33/58*   (2010.01)
*G02B 5/30*    (2006.01)

(52) U.S. Cl.
CPC .............. *H01L 33/58* (2013.01); *G02B 5/3058* (2013.01); *H01L 51/5271* (2013.01)
USPC .......... 359/486.01; 257/40; 257/98; 313/504; 313/506; 349/85; 349/96; 349/97; 359/485.02; 359/485.05; 359/486.02

(58) Field of Classification Search
CPC ... G02B 5/3058; H01L 51/5271; H01L 33/58
USPC .......... 257/40, 98; 313/504, 506; 349/85, 96, 349/97; 359/485.02, 485.05, 486, 486.01, 359/486.02
See application file for complete search history.

(56) References Cited

U.S. PATENT DOCUMENTS

| 7,772,768 | B2 * | 8/2010 | Oh et al. .................. 313/506 |
| 2008/0117510 | A1 | 5/2008 | Cheong et al. |
| 2008/0225389 | A1 * | 9/2008 | Oh et al. .................. 359/486 |
| 2008/0258614 | A1 * | 10/2008 | Ha et al. .................. 313/504 |
| 2009/0074992 | A1 | 3/2009 | Lee et al. |
| 2009/0168171 | A1 * | 7/2009 | Perkins et al. .............. 359/486 |
| 2013/0320320 | A1 * | 12/2013 | Kwon et al. ................. 257/40 |

FOREIGN PATENT DOCUMENTS

| KR | 10-2008-0046017 A | 5/2008 |
| KR | 10-2009-0028334 A | 3/2009 |
| KR | 10-2010-0123977 A | 11/2010 |

* cited by examiner

*Primary Examiner* — Dao H Nguyen
(74) *Attorney, Agent, or Firm* — Knobbe, Martens, Olson & Bear, LLP (57) ABSTRACT

A wire grid type polarization structure is disclosed. In one aspect, the polarization structure includes a retardation layer and a plurality of nanowires formed on the retardation layer. Each of the nanowires includes a wire core and a shell enclosing the wire core. The wire cores include metal nanoparticles embedded therein. The metal nanoparticles may absorb the visible lights effectively, so that the wire grid type polarization structure may have a desired polarization characteristic.

14 Claims, 5 Drawing Sheets

SECOND
DIRECTION      FIRST
   ⊗     ⟶  DIRECTION

WIRE GRID TYPE POLARIZATION STRUCTURES, METHODS OF MANUFACTURING WIRE GRID TYPE POLARIZATION STRUCTURES, AND ORGANIC LIGHT EMITTING DIODE (OLED) DISPLAYS HAVING WIRE GRID TYPE POLARIZATION STRUCTURES

CROSS-REFERENCE TO RELATED APPLICATION(S)

This application claims priority under 35 USC §119 to Korean Patent Applications No. 10-2012-0082227, filed on Jul. 27, 2012 in the Korean Intellectual Property Office (KIPO), the contents of which are incorporated herein in its entirety by reference.

BACKGROUND

1. Technical Field

The described technology generally relate to a wire grid type polarization structure, a method of manufacturing a wire grid type polarization structure, and an OLED display including a wire grid type polarization structure.

2. Description of the Related Technology

Organic light emitting diode (OLED) displays display information of images or characters by using light generated as holes and electrons, which are provided from an anode and a cathode, respectively, are combined with each other at an organic light emitting layer interposed between the anode and the cathode. The OLED displays have been spotlighted as next-generation display devices because they have various advantages such as a wide viewing angle, a rapid response speed, slimness, and low power consumption. The OLED displays may additionally include a polarization structure to prevent a reflection of an external light.

SUMMARY

One inventive aspect is a wire grid type polarization structure having a reduced thickness and an improved optical characteristic.

Another aspect is a method of manufacturing a wire grid type polarization structure having a reduced thickness and an improved optical characteristic.

Another aspect is an OLED display having a wire grid type polarization structure that has a reduced thickness and an improved optical characteristic.

Another aspect is a wire grid type polarization structure which includes a retardation layer and a plurality of nanowires formed on the retardation layer. Each of the nanowires includes a wire core and a shell enclosing the wire core. The wire cores include metal nanoparticles embedded therein.

In some example embodiments, the metal nanoparticles may include at least three different types of metal nanoparticles.

In some example embodiments, the metal nanoparticles may include first nanoparticles, second nanoparticles and third nanoparticles. The first nanoparticles may include rod-shaped particles containing gold which are configured to absorb a red color of light, the second nanoparticles may include sphere-shaped particles containing gold which are configured to absorb a green color of light, and the third nanoparticles may include sphere-shaped particles containing silver or an alloy of silver which are configured to absorb a blue color of light.

In some example embodiments, the wire core may include polymethylmethacrylate, polyvinylidene fluoride, polyethylene oxide, polysulfone, poly(dodecylthiophene), poly 4-vinylphenol, poly-urethane, polyacrylonitrile, polycarbonate or cycloolefin polymer.

In some example embodiments, a cross-section of each wire core may be circular, elliptical, or square-shaped.

In some example embodiments, each of the wire cores may have a thickness above about 100 nm, and each of the nanowires may have a thickness below about a quarter of wavelengths of the visible lights.

In some example embodiments, the metal nanoparticles may absorb the visible lights which have wavelengths in a range of about 370 nm to about 1000 nm.

In some example embodiments, the plurality of the nanowires may extend in a first direction, and may form a single layer structure In some example embodiments, the plurality of the nanowires may extend in a first direction, and may form a multi layer structure.

In some example embodiments, the retardation layer may cause a phase difference between two polarization components of an incident light, and the phase difference may correspond to a quarter wavelength of the incident light.

According to some example embodiments, a wire grid type polarization structure includes a retardation layer and a plurality of nanowires on the retardation layer. Each of the nanowires includes a wire core and a shell enclosing the wire core. The wire cores include a dye which absorbs an incident light In some example embodiments, each of the wire cores may include polyvinylalcohol, and the dye may include divalent iodine or trivalent iodine substituted with a functional group of polyvinylalcohol.

Another aspect is an OLED display which includes a display panel and a wire grid type polarization structure. The display panel includes a switching structure, a first electrode, a light emitting structure and a second electrode. The wire grid type polarization structure includes a retardation layer and a plurality of nanowires on the retardation layer. Each of the nanowires includes a wire core and a shell enclosing the wire core. The wire cores include metal nanoparticles embedded therein.

According to some example embodiments, a first source is filled in a first syringe of an electrospinning apparatus. A second source is filled in a second syringe which surrounds an outer circumference of the first syringe. A substrate is arranged to face the electrospinning apparatus. Nanowires may be formed by pressurizing the first syringe and the second syringe. The nanowires may be arranged on the substrate. The first source may include a first polymer solution and metal nanoparticles, and the second source may include a second polymer solution.

Another aspect is a wire grid type polarization structure which includes nanowires having shells and wire cores in which metal nanoparticles or dye may be embedded. The metal nanoparticles or the dye may absorb the visible lights effectively, so that the wire grid type polarization structure may have a desired polarization characteristic. Also, the wire grid type polarization structure may include the nanowires and a retardation layer, such that the wire grid type polarization structure may have a relatively small thickness. Additionally, a protection layer including cellulose triacetate (TAC) may be omitted, so that the wire grid type polarization structure may have an improved flexibility to be used at a flexible display.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Generally, a polarization structure includes a film type polarizer including a stretch-aligned polyvinylalcohol (PVA). The polarization structure typically includes a protection layer such as a triacetyl-cellulose (TAC) layer on both surfaces of the polarizer film to prevent a distortion of the polarizer film. Therefore, the above polarization structure may have a relatively large thickness and a relatively low flexibility, and it may be hard to apply the polarization structure to a flexible display.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
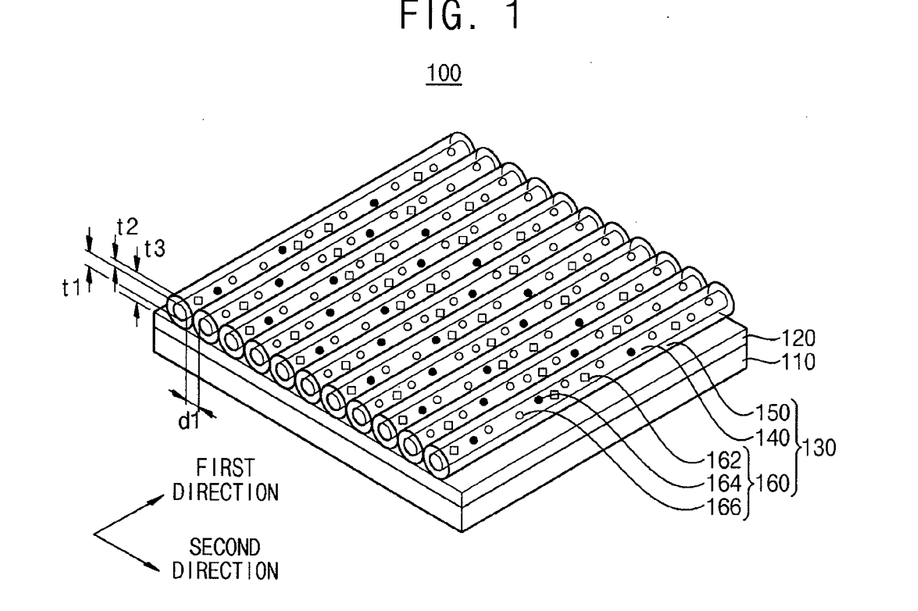
FIG. 1 is a perspective view illustrating a wire grid type polarization structure in accordance with example embodiments.

FIG. 1 is a perspective view illustrating a wire grid type polarization structure in accordance with example embodiments.

Referring to FIG. 1, the wire grid type polarization structure 100 may include a substrate 110, a retardation layer 120, a plurality of nanowires 130, etc.

The substrate 110 may include a transparent insulating substrate. For example, the substrate 110 may include a glass substrate, a quartz substrate, a transparent resin substrate, a transparent ceramic substrate, etc. In some example embodiments, the substrate 110 may serve as a first substrate, a second substrate or a window of a display panel. The substrate 110 may support the retardation layer 120 and the nanowires 130.

The retardation layer 120 may be disposed on the substrate 110. For example, the retardation layer 120 may include a birefringent film containing a polymer such as polystyrene, polycarbonate, polyvinylalcohol, polypropylene, polymethylmethacrylate, polyolefine, polyarylate, polyamide, cyclo-olefin polymer, cyclo-olefin copolymer, etc., an alignment film of liquid crystal polymer and/or an alignment layer containing liquid crystal polymer.

The retardation layer 120 may ensure a phase difference between two polarization components of light incident thereto. The retardation layer 120 may cause a predetermined phase difference between two polarization components which are substantially perpendicular to each other. For example, the predetermined phase difference corresponds to a quarter wavelength of the incident light. In some example embodiments, the retardation layer 120 includes a uni-axially stretched film, a bi-axially stretched film or an inverse wavelength dispersion type retardation film. Accordingly, the retardation layer 120 may convert a linearly polarized light into a circularly polarized light or may convert a circularly polarized light into a linearly polarized light.

Each of the nanowires 130 may include a wire core 140 and a shell 150 which may be disposed on the retardation layer 120. Each of the wire cores 140 may include metal nanoparticles 160 therein, and each of the shells 150 may substantially enclose each of the wire cores 140. The plurality of nanowires 130 may be arranged in a second direction, and each of the nanowires 130 may extend in a first direction which is substantially perpendicular to the second direction. Therefore, the nanowires 130 may form a single nanowire layer.

The wire cores 140 may be disposed above the retardation layer 120, and may extend in the first direction. Also, a plurality of wire cores 140 may be arranged in the second direction, and may be spaced apart with a first distance (D1) from one another. In this case, each of the wire cores 140 may have substantially circular cross-section having a first thickness (T1). The wire cores 140 may include a transparent polymer. For example, the transparent polymer may include polymethylmethacrylate (PMMA), polyvinylidene fluoride (PVDF), polyethylene oxide (PEO), polysulfone (PSU), poly(dodecylthiophene) (PDT), poly 4-vinylphenol (PVP), poly-urethane (PU), polyacrylonitrile (PAN), polycarbonate (PC), cycloolefin polymer (COP), etc.

The metal nanoparticles 160 may include at least three different types of metal nanoparticles which may be embedded in the wire cores 140. For example, the metal nanoparticles 160 may include first nanoparticles 162, second nanoparticles 164 and third nanoparticles 166. In this case, the first nanoparticles 162 may absorb a light adjacent to a red color, the second nanoparticles 164 may absorb a light adjacent to a green color, and the third nanoparticles 166 may absorb a light adjacent to a blue color. Accordingly, the wire cores 140 including the first, the second and the third nanoparticles 162, 164 and 166 may absorb the visible lights which have wavelengths in the range of about 370 nm to about 1000 nm.

Materials, sizes and shapes of the first, the second and the third nanoparticles 162, 164 and 166 may be adjusted depending on the wavelength of light which may be absorbed. For example, each of the nanoparticles 162, 164 and 166 may include at least one of the following: gold (Au), silver (Ag), copper (Cu) and silicon oxide. The first, the second and the third nanoparticles 162, 164 and 166 may include sphere-shaped particles, rod-shaped particles, core/shell shaped particles, etc.

In some example embodiments, the first nanoparticles 162 may include rod-shaped particles containing gold (Au), a ratio between lengths and widths of the rod-shaped particles may be in the range of about 1.5:1 to about 2.5:1, and widths of the rod-shaped particles may be in the range of about 20 nm to about 30 nm. The second nanoparticles 164 may include sphere-shaped particles containing silver (Ag) or core/shell shaped particles having the core containing silicon oxide and the shell containing gold (Au), and diameters of the sphere-shaped particles may be in the range of about 20 nm to about 50 nm. The third nanoparticles 166 may include sphere-shaped particles containing silver (Ag), or an alloy of silver, and diameters of the sphere-shaped particles may be in the range of about 20 nm to about 50 nm.

In an example embodiment, the first nanoparticles 162 includes rod-shaped particles containing gold (Au), a ratio between lengths and widths of the rod-shaped particles may be about 2:1, and widths of the rod-shaped particles may be about 30 nm. The second nanoparticles 164 may include sphere-shaped particles containing gold, and diameters of the sphere-shaped particles may be about 30 nm. The third nanoparticles 166 may include sphere-shaped particles containing silver, and diameters of the sphere-shaped particles may be about 30 nm. Therefore, the first nanoparticles 162 may absorb the lights which have the wavelengths in the range of about 600 nm to about 1000 nm, the second nanoparticles 164 may absorb the lights which have the wavelengths in the range of about 480 nm to about 600 nm, and the third nanoparticles 166 may absorb the lights which have the wavelengths in the range of about 370 nm to about 480 nm. Accordingly, the nanoparticles 162, 164 and 166 may absorb the visible lights which have the wavelengths in the range of about 370 nm to about 1000 nm.

Each of the shells 150 may substantially enclose each of the wire cores 140, and may have a second thickness (T2). The shells 150 may include a polymer which may substantially the same as or substantially similar to that of the wire cores 140. Therefore, each of the nanowires 130 including the wire core 140 and the shell 150 may have a third thickness (T3).

The first distance (D1) between the wire cores 140, the first thickness (T1) of the wire core 140 and the third thickness (T3) of the nanowire 130 may be adjusted depending on the wavelengths of the incident lights, material characteristics (for example, refractive index) of the wire core 140 and the shell 150, etc. For example, the first distance (D1) between the wire cores 140 must be smaller than a half wavelength of the incident light to improve the polarization characteristics of the wire grid type polarization structure 100. Therefore, when the minimum wavelength of the visible light (that is, about 370 nm) is considered, the first distance (D1) between the wire cores 140 may be smaller than about 185 nm, and the second thickness (T2) of the shell 150 may be smaller than about 92.5 nm. Also, when the first thickness (T1) of the wire core 140 is smaller than about 100 nm, a back scattering phenomenon may be occurred by the Rayleigh scattering. Therefore, the first thickness (T1) of the wire core 140 may be larger than about 100 nm to prevent the back scattering phenomenon. In an example embodiment, the first thickness (T1) of the wire core 140 may be in the range of about 500 nm to about 800 nm, and the third thickness (T3) of the nanowire 130 may be in the range of about 700 nm to about 1000 nm.

The wire cores 140 are illustrated to have substantially circular cross-section in FIG. 1. However, the inventive concept may not be limited to the above-described construction. For example, the cross-sections of the wire cores 140 may be elliptical or square-shaped.

According to example embodiments, the wire grid type polarization structure 100 includes the nanowires 130 having the shells 150 and the wire cores 140 in which the metal nanoparticles 160 may be embedded. The metal nanoparticles 160 may absorb the visible lights effectively, so that the wire grid type polarization structure 100 may have a desired polarization characteristic. Also, the wire grid type polarization structure 100 may include the nanowires 130 and the retardation layer 120, such that the wire grid type polarization structure 100 may have a relatively small thickness. Additionally, a protection layer including cellulose triacetate (TAC) may be omitted, so that the wire grid type polarization structure 100 may have an improved flexibility to be used at a flexible display.

Figure 2:
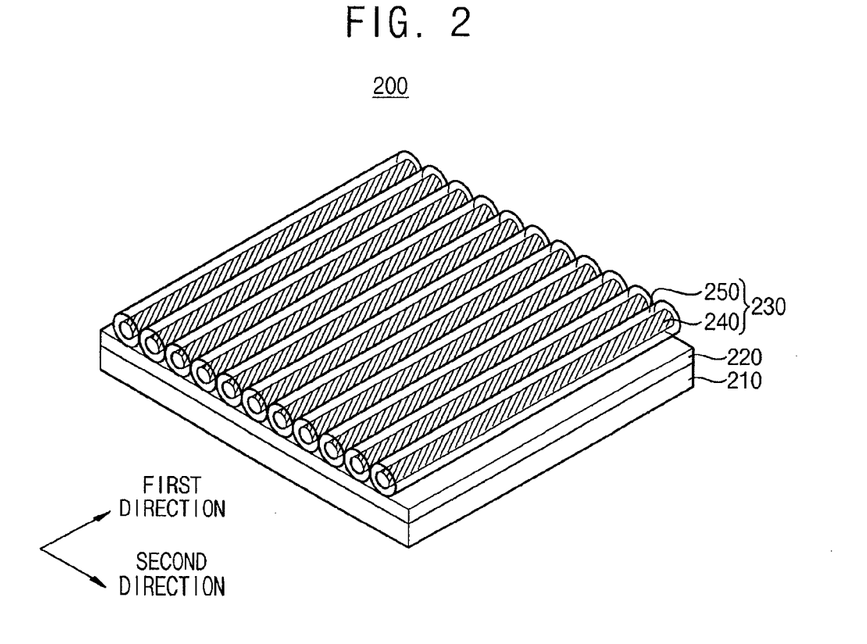
FIG. 2 is a perspective view illustrating a wire grid type polarization structure in accordance with some example embodiments.

FIG. 2 is a perspective view illustrating a wire grid type polarization structure in accordance with some example embodiments.

Referring to FIG. 2, the wire grid type polarization structure 200 may include a substrate 210, a retardation layer 220, a plurality of nanowires 230, etc. The wire grid type polarization structure 200 may be substantially the same as or substantially similar to those described with reference to FIG. 1 except for the nanowires 230.

The nanowires 230 may be disposed on the retardation layer 220, and each of the nanowires 230 may include a wire core 240 and a shell 250 enclosing the wire core 240. In this case, the nanowires 230 may form a single nanowire layer.

Each of the wire cores 240 may extend in a first direction on the retardation layer 220. In this case, a plurality of wire cores 240 may be arranged in a second direction substantially perpendicular to the first direction, and may be spaced apart with a first distance (D1) from one another.

The wire cores 240 may include a polymer and a dye which absorb an incident light. The polymer may include polyvinyl alcohol (PVA), and the dye may be divalent iodine or trivalent iodine which may be substituted with a functional group of polyvinylalcohol.

The wire grid type polarization structure 200 may include the nanowires 230 having the shells 250 and the wire cores 240 in which the dye may be embedded. The dye may absorb the visible lights effectively, so that the wire grid type polarization structure 200 may have a desired polarization characteristic. Additionally, a protection layer including cellulose triacetate may be omitted, so that the wire grid type polarization structure 200 may have an improved flexibility to be used at a flexible display.

Figure 3:
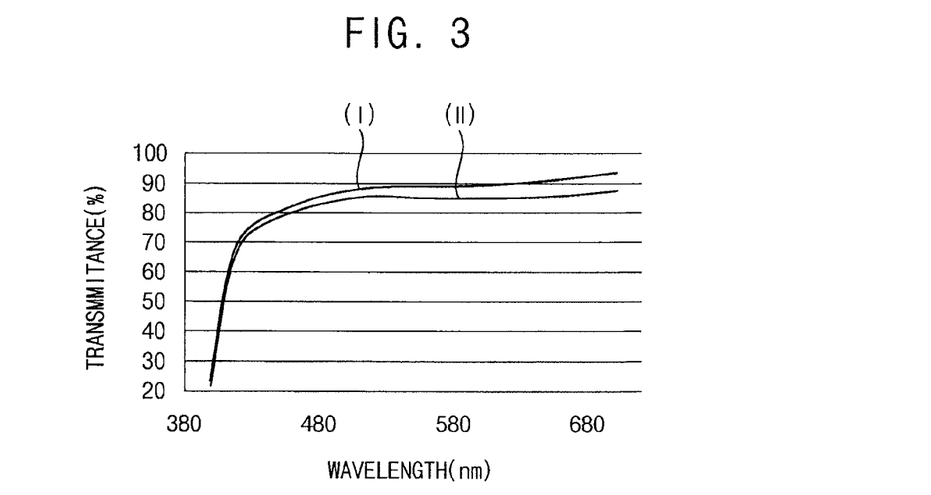
FIG. 3 is a graph showing polarization characteristics of a wire grid type polarization structure in accordance with some example embodiments.

FIG. 3 is a graph showing polarization characteristics of a wire grid type polarization structure 200 in accordance with FIG. 2.

Referring to FIG. 3, the x-axis represents the wavelengths of the incident lights, while the y-axis represents the transmittance of the incident light in a direction parallel to the polarization axis (that is, parallel nicols). The polarization characteristic (I) of the wire grid type polarization structure 200 including the nanowires 230 having diameters of about 700 nm and the wire cores 240 having diameters of about 500 nm may be advantageously compared to the polarization characteristic (II) of a wire grid type polarization structure.

According to a calculated result, the wire grid type polarization structure 200 may have the improved transmittance at a relatively long wavelength compared to the wire grid type polarization structure having the polarization characteristic (II). Therefore, the wire grid type polarization structure 200 in accordance with example embodiments may have an improved polarization characteristic.

Figure 4:
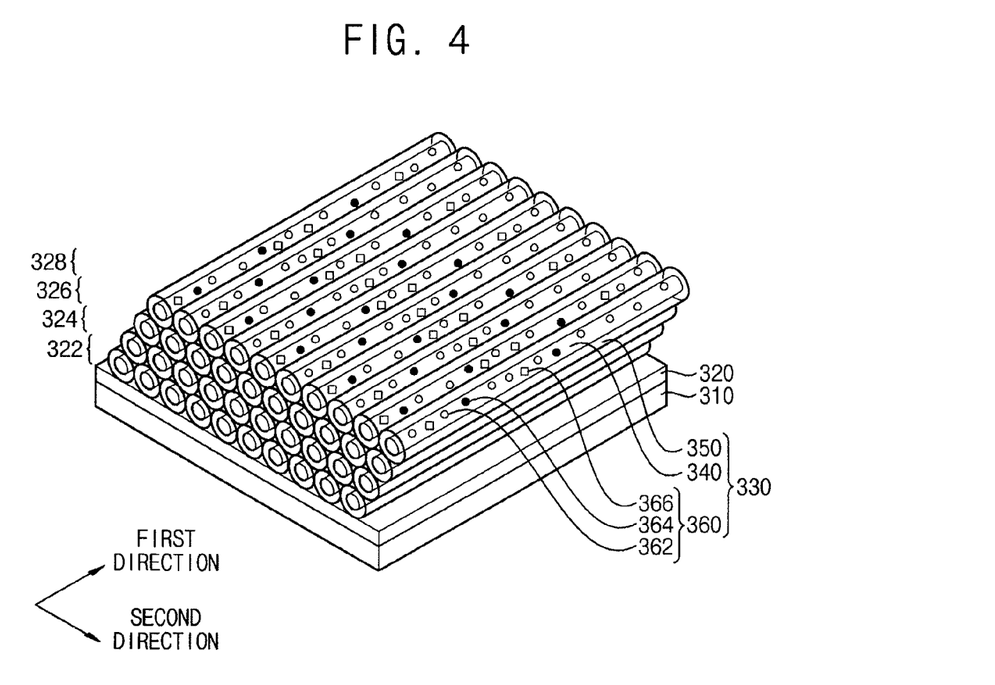
FIG. 4 is a perspective view illustrating a wire grid type polarization structure in accordance with some example embodiments.

FIG. 4 is a perspective view illustrating a wire grid type polarization structure in accordance with some example embodiments.

Referring to FIG. 4, the wire grid type polarization structure 300 may include a substrate 310, a retardation layer 320, a plurality of nanowire layers, etc. The wire grid type polarization structure 300 may be substantially the same as or substantially similar to those described with reference to FIG. 1 except for the plurality of nanowire layers.

In some example embodiments, the nanowire layers include a first nanowire layer 322, a second nanowire layer 324, a third nanowire layer 326 and a fourth nanowire layer 328. The nanowire layers 322-328 may include a plurality of nanowires 330 which may be substantially the same as or substantially similar to the nanowures 130 described with reference to FIG. 1

Each of the nanowire layers 322-328 may be arranged alternately and repeatedly. The nanowire layers 322-328 may be arranged such that cross sections of the nanowires 330 may form a triangle-lattice structure as illustrated in FIG. 4. Alternatively, the nanowire layers 322-328 may be arranged such that cross sections of the nanowires 330 may form a rectangular-lattice structure.

According to example embodiments, the wire grid type polarization structure 300 may include the plurality of nanowire layers 322-328 to have an improved polarization characteristic. Each of the nanowire layers 322-328 may include the nanowires 330 having the shells 350 and the wire cores 340 in which the metal nano particles 360 may be embedded. The metal nano particles 360 may absorb the visible lights effectively, so that the wire grid type polarization structure 300 have an improved polarization characteristic.

Figure 5:
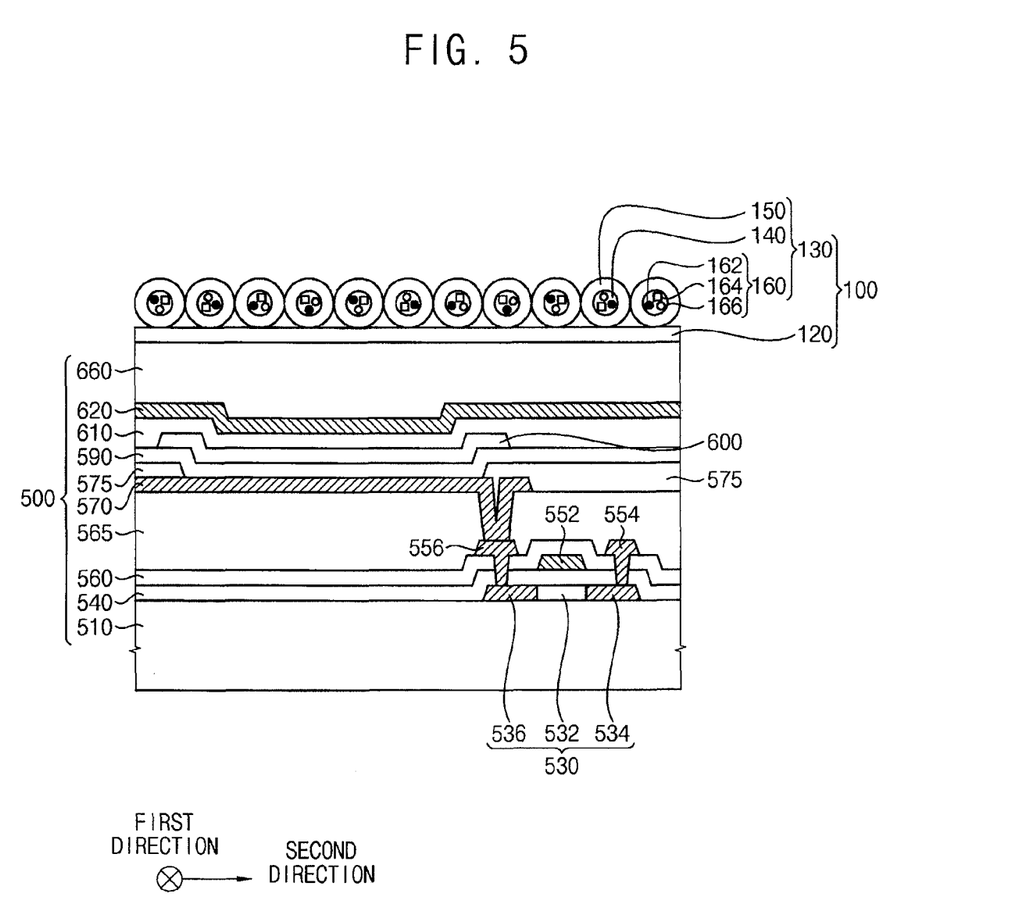
FIG. 5 is a cross sectional view illustrating an OLED display including a wire grid type polarization structure in accordance with example embodiments.

FIG. 5 is a cross sectional view illustrating an OLED display including a wire grid type polarization structure in accordance with example embodiments.

Referring to FIG. 5, the OLED display may include a display panel 500 and a wire grid type polarization structure 100 on the display panel 500.

The display panel 500 may be formed to include a first substrate 510, a switching structure, a first electrode 570, a light emitting structure, a second electrode 620, etc. Although the OLED display illustrated in FIG. 5 may have a bottom emission type, the OLED display may have a top emission type in accordance with materials included in the first and the second electrodes 570 and 620.

The switching structure may be disposed on the first substrate 510, and the first electrode 570 may be disposed on the switching structure to be electrically connected to the switching structure. The light emitting structure may be disposed between the first electrode 570 and the second electrode 620.

The first substrate 510 may include a transparent insulation substrate. For example, the first substrate 510 may include a glass substrate, a transparent plastic substrate, etc. Alternatively, the first substrate 510 may include a flexible substrate.

When the OLED display has an active matrix type, the switching structure may be formed on the first substrate 510. In some example embodiments, the switching structure may include a switching device, at least one insulation layer, a contact, a pad, a plug, etc. Here, the switching device may include a thin film transistor (TFT), an oxide semiconductor device, etc.

When the switching device in the switching structure includes the thin film transistor, the switching device may be obtained by forming a semiconductor layer 530, a gate electrode 552, a source electrode 554, a drain electrode 556, etc.

In some example embodiments, the semiconductor layer 530 may be disposed on the first substrate 510, and the semiconductor layer 530 may be divided into a source region 534, a drain region 536 and a channel region 532 through an ion implantation process. Then, a gate insulation layer 540 may be disposed to electrically isolate the semiconductor layer 530.

A gate electrode 552 may be disposed on the gate insulation layer 540, and then a first insulation layer 560 may be disposed on the gate insulation layer 540 and the gate electrode 552.

The source electrode 554 and the drain electrode 556 may be disposed through the gate insulation layer 540 and the first insulation layer 560 to contact the source and the drain regions 534 and 536, respectively. A gate signal may be applied to the gate electrode 552 and a data signal may be applied to the source electrode 554. Then, a second insulation layer 560 may be disposed to electrically isolate the source electrode 554 and the drain electrode 556.

In the OLED display illustrated in FIG. 5, the switching device including the thin film transistor may have a top gate configuration in which the gate electrode 552 may be disposed over the semiconductor layer 530, however, the configuration of the switching device may not be limited thereto. For example, the switching device may have a bottom gate configuration in which a gate electrode may be disposed under the semiconductor layer.

A second insulation layer 565 may be disposed on the first insulation layer 560 to substantially cover the source electrode 554 and the drain electrode 556. In some example embodiments, the second insulation layer 565 has a substantially flat surface obtained by a planarization process, for example, a chemical mechanical polishing (CMP) process, an etch-back process, etc.

The first electrode 570 may be formed on the switching structure, and a pixel defining layer 575 may be formed in a region on the switching structure where the first electrode 570 is not positioned.

Referring to FIG. 5, the light emitting structure may be obtained by forming a hole transfer layer 590, by forming an organic light emitting layer 600, by forming an electron transfer layer 610, etc. The organic light emitting layer 600 may be formed using an organic material or a mixture of an organic material and an inorganic material for generating a red color of light (or red light), a green color of light (or green light) and/or a blue color of light (or blue light). The organic light emitting layer 600 may have a stacked structure that includes a plurality of light emitting films for generating the red color of light, the green color of light and the blue color of light to thereby provide a white color of light.

In some example embodiments, the organic light emitting layer 600 is formed in a display region, and the pixel defining layer 575 is formed in a peripheral region. Therefore, light generated from the organic light emitting layer 600 may be emitted in the display region whereas the light may not be emitted in the peripheral region.

In some example embodiments, the first electrode 570 serves as an anode for providing holes into the hole transfer layer 590 of the light emitting structure, and the second electrode 620 serves as a cathode for supplying electrons into the electron transfer layer 610. Depending on an emission type of the OLED display, the first electrode 570 may be a transparent electrode or a semi-transparent electrode, and the second electrode 620 may be a reflective electrode. For example, the first electrode 570 may be formed using a transparent conductive material including at least one of the following: indium tin oxide (ITO), zinc tin oxide (ZTO), indium zinc oxide (IZO), zinc oxide (ZnOx), tin oxide (SnOx), gallium oxide (GaOx), etc. The second electrode 620 may be formed using a reflective material such as aluminum (Al), tungsten (W), copper (Cu), nickel (Ni), chromium (Cr), molybdenum (Mo), titanium (Ti), platinum (Pt), silver (Ag), tantalum (Ta), ruthenium (Ru), alloys thereof and nitrides thereof.

The second substrate 660 may be formed on the second electrode 620. The second substrate 660 may be formed using a transparent substrate such as a glass substrate, a quartz substrate, a transparent resin substrate, etc. Alternatively, the second substrate 660 may be formed using a flexible material. The second substrate 660 may substantially oppose to the first substrate 510.

The wire grid type polarization structure 100 may be substantially the same as or substantially similar to those described with reference to FIG. 1, however the inventive concept may not be limited thereto. For example, the OLED display may include the wire grid type polarization structure 200 or 300 described with reference to FIG. 2 or FIG. 3.

According to example embodiments, the OLED display may include the wire grid type polarization structure 100, and the wire grid type polarization structure 100 may include the nanowires 130 having the shells 150 and the wire cores 140 in which the metal nanoparticles 160 may be embedded. The metal nanoparticles 160 may absorb the visible lights effectively, so that the wire grid type polarization structure 100 may have a desired polarization characteristic. Accordingly, the wire grid type polarization structure 100 may prevent or reduce a reflection of an external light, so that the OLED display may display improved quality of images.

Figure 6:
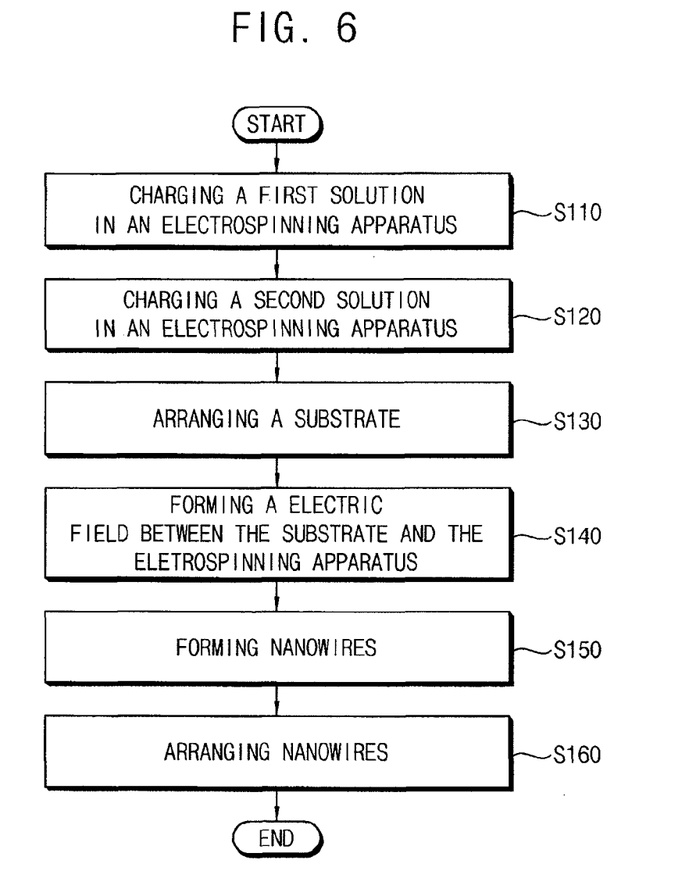
FIG. 6 is a flow chart illustrating a method of manufacturing a wire grid type polarization structure.
Figure 7:
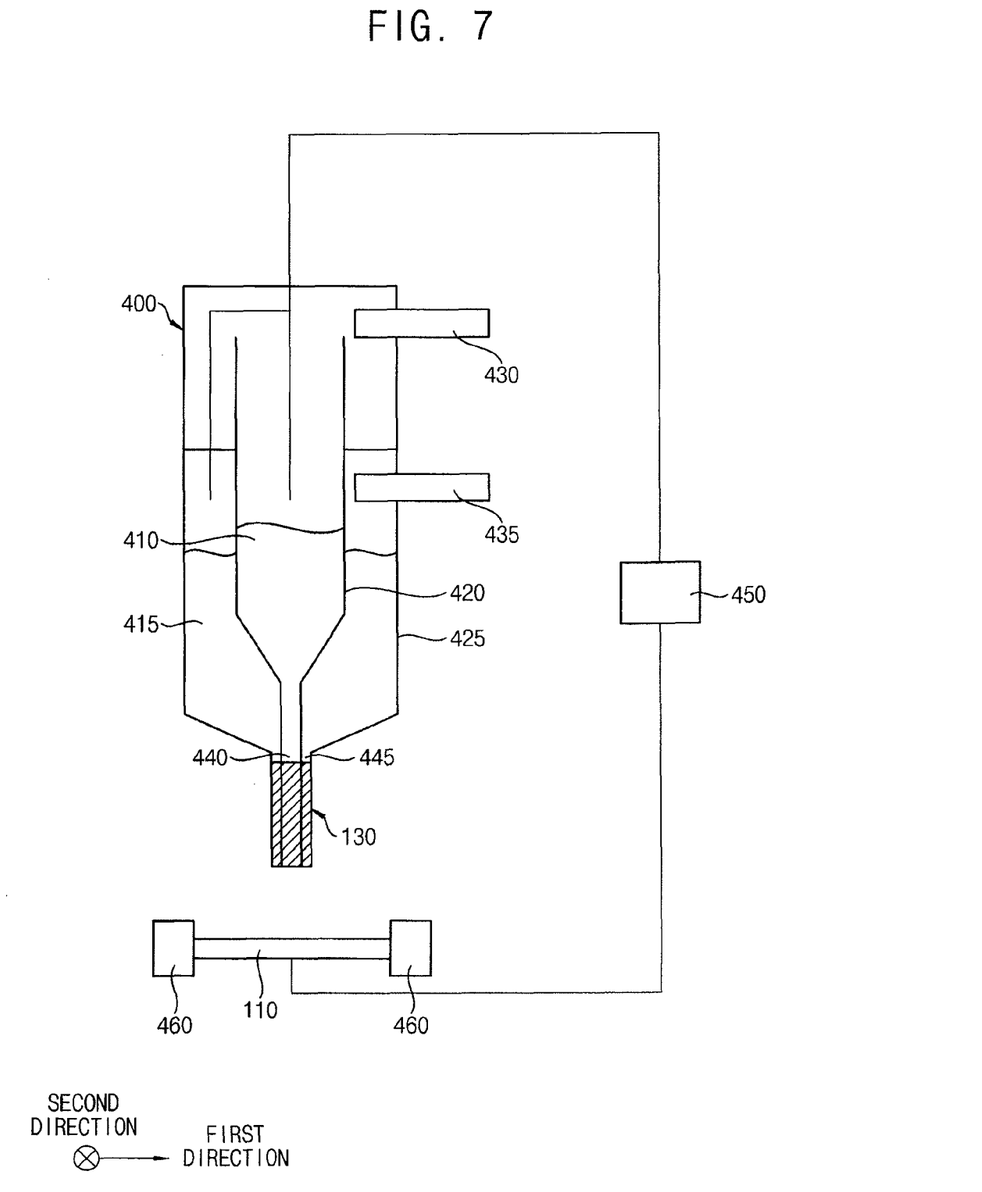
FIG. 7 is a cross sectional view illustrating a method of manufacturing a wire grid type polarization structure.

FIG. 6 is a flow chart illustrating a method of manufacturing a wire grid type polarization structure, and FIG. 7 is a cross sectional view illustrating a method of manufacturing a wire grid type polarization structure.

Referring to FIGS. 6 and 7, a first source 410 may be filled in a first syringe 420 of an electrospinning apparatus 400 (S110).

The electrospinning apparatus 400 may include the first syringe 420, a first pressurizing part 430 at one end of the first syringe 420 and a first nozzle 440 at another end of the first syringe 420. Also, the electrospinning apparatus 400 may include the second syringe 425 surrounding an outer circumference of the first syringe 420, a second pressurizing part 435 at one end of the second syringe 425 and a second nozzle 445 at another end of the second syringe 425. In this case, the second nozzle 445 may be disposed to surround an outer circumference of the first nozzle 440.

The first source 410 may include a polymer solution such as PMMA, PVDF, PEO, PSU, PDT, PVP, PU, PAN, PC, COP, etc. The first source 410 may further include metal nano particles 160 dispersed in the polymer solution. The metal nano particles 160 may be substantially the same as or substantially similar to those described with reference to FIG. 1. The first source 410 filled in the first syringe 420 may maintain a sol phase or a gel phase.

A second source 415 may be filled in the second syringe 425 (S120).

The second source 415 may include a polymer solution such as PMMA, PVDF, PEO, PSU, PDT, PVP, PU, PAN, PC, COP, etc. The second source 415 filled in the second syringe 425 may maintain a sol phase or a gel phase.

A substrate 110 may be arranged to face the electrospinning apparatus 400 (S130).

The substrate 110 may be substantially the same as or substantially similar to those described with reference to FIG. 1. Also, a retardation layer (not shown) may be further disposed on the substrate 110. In some example embodiments, the substrate 110 may be spaced apart from the electrospinning apparatus 400 with a predetermined distance to face the first and the second nozzles 440 and 445.

Then, an electrical field may be formed between the electrospinning apparatus 400 and the substrate 110 (S140).

Using a power supply 450 which is connected to the electrospinning apparatus 400 and the substrate 110, an electrical potential difference may be formed between the electrospinning apparatus 400 and the substrate 110. For example, a voltage of about 1 kV to about 100,000 kV may be applied to the electrospinning apparatus 400, and the substrate 110 may be grounded. The supplied voltage may be adjusted depending on the distance between the electrospinning apparatus 400 and the substrate 110. Therefore, the first source 410 in the first syringe 420 and the second source 415 in the second syringe 425 may be electrified by the supplied voltage.

The first source 410 and the second source 415 may be emitted on the substrate 110 to form nanowires 130 (S150).

In some example embodiments, the first pressurizing part 430 may pressurize the first source 410 which may be electrified in the first syringe 420, and the second pressurizing part 435 may pressurize the second source 415 which may be electrified in the second syringe 425. Therefore, the first source 410 and the second source 415 may be emitted through the first nozzle 440 and the second nozzle 445, respectively. Accordingly, a wire core may be formed from the first source 410, and a shell enclosing the wire core may be formed from the second source 415, thereby forming nanowires 130.

The nanowires 130 may be arranged to extend in a direction (S 160).

The nanowire 130 is electrified and then scattered on a substrate 110. Plates 460 electrified with opposite charges to the nanowires 130 are provided beside both ends of the substrate 110. For example, if the nanowires 130 is electrified with positive charges, the plates 460 electrified with negative charges are disposed beside the opposite ends of the substrate 110.

Therefore, an electrostatic attractive force may act between surface charges of the nanowires 130 and the plates 460. Thus, both ends of the nanowires 130 are respectively pulled toward the plates 460. As a result, the nanowire 130 is tightly arranged on the substrate 110. Also, a repulsive force acts between the nanowires 130 electrified with the same charges. Thus, a plurality of nanowires 130 are arranged at regular intervals.

According to at least one of the disclosed embodiments, a wire grid type polarization structure includes nanowires having shells and wire cores in which metal nanoparticles or dye may be embedded. The metal nanoparticles or the dye may absorb the visible lights effectively, so that the wire grid type polarization structure may have a desired polarization characteristic.

The present inventive concept may be applied to an electric device having a display device. For example, the present inventive concept may be applied to a monitor, a laptop, a PDA, a cellular phone, a smart phone, a smart pad, etc. The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A wire grid type polarization structure comprising:
   a retardation layer; and
   a plurality of nanowires formed on the retardation layer, wherein each of the nanowires comprises a wire core and a shell enclosing the wire core, and wherein the wire cores comprise metal nanoparticles embedded therein.

2. The polarization structure of claim 1, wherein the metal nanoparticles comprise at least three different types of metal nanoparticles.

3. The polarization structure of claim 2, wherein the metal nanoparticles comprise first nanoparticles, second nanoparticles and third nanoparticles, and
   wherein the first nanoparticles comprise rod-shaped particles containing gold which are configured to absorb red light, wherein the second nanoparticles comprise sphere-shaped particles containing gold which are configured to absorb green light, and wherein the third nanoparticles comprise sphere-shaped particles containing silver or an alloy of silver which are configured to absorb blue light.

4. The wire grid type polarization structure of claim 1, wherein the wire core comprises at least one polymer selected from the group consisting of polymethylmethacrylate, polyvinylidene fluoride, polyethylene oxide, polysulfone, poly (dodecylthiophene), poly 4-vinylphenol, poly-urethane, polyacrylonitrile, polycarbonate and cycloolefin polymer.

5. The wire grid type polarization structure of claim 1, wherein a cross-section of each wire core is circular, elliptical or square-shaped.

6. The wire grid type polarization structure of claim 1, wherein each of the wire cores has a thickness of about 100 nm or greater, and wherein each of the nanowires has a thickness less than about a quarter of wavelengths of the visible lights.

7. The wire grid type polarization structure of claim 1, wherein the metal nanoparticles are configured to absorb the visible lights which have wavelengths in the range of about 370 nm to about 1000 nm.

8. The wire grid type polarization structure of claim 1, wherein the nanowires extend in a first direction, and form a single layer structure.

9. The wire grid type polarization structure of claim 1, wherein the nanowires extend in a first direction, and form a multi layer structure.

10. The wire grid type polarization structure of claim 1, wherein the retardation layer is configured to cause a phase difference between two polarization components of an incident light, and wherein the phase difference corresponds to a quarter wavelength of the incident light.

11. An organic light emitting diode (OLED) display comprising:
    a display panel comprising a switching structure, a first electrode, a light emitting structure and a second electrode; and
    a wire grid type polarization structure formed on the display panel,
    wherein the wire grid type polarization structure comprises:
       a retardation layer; and
       a plurality of nanowires formed on the retardation layer, wherein each of the nanowires comprises a wire core and a shell enclosing the wire core, and wherein the wire cores comprise metal nanoparticles embedded therein.

12. The OLED display of claim 11, wherein the metal nanoparticles comprise first nanoparticles, second nanoparticles and third nanoparticles, and
    wherein the first nanoparticles comprise rod-shaped particles containing gold which are configured to absorb red light, wherein the second nanoparticles comprise sphere-shaped particles containing gold which are configured to absorb green light, and wherein the third nanoparticles comprise sphere-shaped particles containing silver or an alloy of silver which are configured to absorb blue light.

13. The OLED display of claim 11, wherein a cross-section of each wire core is circular, elliptical or square-shaped.

14. The OLED display of claim 1, wherein the wire core has a thickness of about 100 nm or greater, and wherein each of the nanowires has a thickness less than about a quarter of wavelengths of the visible lights.

* * * * *